(12) United States Patent
Divigalpitiya et al.

(10) Patent No.: US 10,041,748 B2
(45) Date of Patent: Aug. 7, 2018

(54) CARBON COATED ARTICLES AND METHODS FOR MAKING THE SAME

(71) Applicant: 3M INNOVATIVE PROPERTIES COMPANY, St. Paul, MN (US)

(72) Inventors: Ranjith Divigalpitiya, London (CA); Sabastine Ezugwu, London (CA); Giovanni Fanchini, London (CA)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 262 days.

(21) Appl. No.: 14/366,308

(22) PCT Filed: Dec. 19, 2012

(86) PCT No.: PCT/US2012/070438
§ 371 (c)(1),
(2) Date: Jun. 18, 2014

(87) PCT Pub. No.: WO2013/096350
PCT Pub. Date: Jun. 27, 2013

(65) Prior Publication Data
US 2014/0329082 A1    Nov. 6, 2014

Related U.S. Application Data (60) Provisional application No. 61/579,320, filed on Dec. 22, 2011, provisional application No. 61/645,921, filed on May 11, 2012.

(51) Int. Cl.
| | |
|---|---|
| *F28F 21/02* | (2006.01) |
| *F28F 21/06* | (2006.01) |
| *H01B 1/04* | (2006.01) |
| *H01B 1/12* | (2006.01) |
| *H01L 51/44* | (2006.01) |
| *B32B 27/08* | (2006.01) |
| *B32B 27/20* | (2006.01) |
| *B32B 37/24* | (2006.01) |
| *B82Y 30/00* | (2011.01) |
| *H01L 51/00* | (2006.01) |

(52) U.S. Cl.
CPC .............. *F28F 21/02* (2013.01); *B32B 27/08* (2013.01); *B32B 27/20* (2013.01); *F28F 21/06* (2013.01); *H01B 1/04* (2013.01); *H01B 1/127* (2013.01); *H01B 1/128* (2013.01); *H01L 51/442* (2013.01); *B32B 37/24* (2013.01); *B32B 2264/108* (2013.01); *B32B 2307/302* (2013.01); *B32B 2307/412* (2013.01); *B32B 2307/704* (2013.01); *B32B 2313/04* (2013.01); *B32B 2367/00* (2013.01); *B32B 2457/00* (2013.01); *B82Y 30/00* (2013.01); *F28F 2245/06* (2013.01); *H01L 51/0037* (2013.01); *H01L 51/0045* (2013.01); *Y02E 10/549* (2013.01); *Y10T 428/265* (2015.01); *Y10T 428/30* (2015.01)

(58) Field of Classification Search
CPC ... B32B 27/08; B32B 27/20; B32B 2307/704; B32B 2264/108; B32B 2307/412; B32B 2307/302; B32B 2367/00; B32B 37/24; B32B 2313/04; B32B 2457/00; B82Y 30/00; F28F 21/02; F28F 21/06; F28F 2245/06; H01L 51/442; H01L 51/0045; H01L 51/0037; H01B 1/128; H01B 1/127; H01B 1/04
See application file for complete search history.

(56) References Cited

U.S. PATENT DOCUMENTS

| | | |
|---|---|---|
| 6,511,701 B1 | 1/2003 | Divigalpitiya |
| 7,390,560 B2 | 6/2008 | Wallach |
| 7,750,555 B2 | 7/2010 | Song |
| 2003/0019518 A1 | 1/2003 | Shimizu |
| 2008/0023066 A1 | 1/2008 | Hecht |
| 2008/0248275 A1 | 10/2008 | Jang |
| 2008/0259262 A1 | 10/2008 | Jones |
| 2008/0264482 A1 | 10/2008 | Lee |
| 2008/0314626 A1 | 12/2008 | Moore |
| 2009/0022974 A1 | 1/2009 | Lee |
| 2009/0295285 A1 | 12/2009 | Tokunaga |
| 2010/0040950 A1 | 2/2010 | Buiel |
| 2010/0190008 A1 | 7/2010 | Wu |
| 2010/0263908 A1 | 10/2010 | Lee |
| 2011/0001054 A1 | 1/2011 | Frank |
| 2011/0001905 A1 | 1/2011 | Tanaka |
| 2011/0273085 A1 | 11/2011 | Garbar |

FOREIGN PATENT DOCUMENTS

| | | |
|---|---|---|
| CN | 1414818 | 4/2003 |
| CN | 101945710 | 1/2011 |
| EP | 684652 | 11/1995 |
| JP | 2009-211978 | 9/2009 |
| KR | 2007-0099787 | 10/2007 |
| WO | WO 2001/085361 | 11/2001 |

(Continued)

OTHER PUBLICATIONS

Jackson, "Photothermal deflection spectroscopy and detection", Applied Optics, Apr. 15, 1981, vol. 20, No. 8, pp. 1333-1344.

(Continued)

*Primary Examiner* — Cheng Huang
(74) *Attorney, Agent, or Firm* — Adam Bramwell (57) ABSTRACT

An article includes a substrate having a first major surface and optionally a second major surface. A layering arrangement is disposed on either or both of the first major surface and the second major surface. The layering arrangement includes a carbon layer and a conducting polymer layer.

9 Claims, 4 Drawing Sheets

(56) References Cited

FOREIGN PATENT DOCUMENTS

| WO | WO 2008/130365 | 10/2008 |
|---|---|---|
| WO | WO 2008-152889 | 12/2008 |
| WO | WO 2009/086161 | 7/2009 |
| WO | WO 2009-151197 | 12/2009 |
| WO | WO 2012/076473 | 6/2012 |

OTHER PUBLICATIONS

Prlog, "NanoMarkets Issues New Report on ITO and Alternative Transparent Conductors", Jun. 14, 2010, [retrieved from internet on Aug. 19, 2014], URL <http://www.prlog.org/10736825-nanomarkets-issues-new-report-on-ito-and-alternative-transparent-conductors.html>, 3 pages.
International Search Report for PCT Application No. PCT/US2012/070438 dated Apr. 12, 2013, 4 pages.
M. Choe, B. H. Lee, G. Jo, J. Park, W. PArk, S. Lee, W.-K. Hong, M.-J. Seong, Y. H. Kahng, K. Lee, T. Lee, *Organic Electronics* 11 (2010) 1864-1869. ( XP027362781 ).
T. T. Tung, T. Y. Kim, K. S. Suh, Organic Electronics 12 (2011) 22-28. ( XP027576981 ).
EP 12 859 358.9 EP Search Report dated Jul. 21, 2015 (5 pages).

CARBON COATED ARTICLES AND METHODS FOR MAKING THE SAME

CROSS REFERENCE TO RELATED APPLICATIONS

This application is a national stage filing under 35 U.S.C. 371 of PCT/US2012/070438, filed Dec. 19, 2012, which claims priority to U.S. Provisional Application No. 61/645,921, filed May 11, 2012, and which also claims priority to US Provisional Application No. 61/579,320, filed Dec. 22, 2011, the disclosure of which is incorporated by reference in its/their entirety herein.

TECHNICAL FIELD

The present disclosure relates to carbon coated articles, and methods of making the same.

BACKGROUND

Various nano-scale carbon coated articles and methods for making such articles are known. For example, such articles and methods are described in U.S. Patent Application Publication 20080248275 (Jang et al.).

SUMMARY

In some embodiments, an article is provided. The article includes a substrate comprising a first major surface and optionally a second major surface. A layering arrangement is disposed on either or both of the first major surface and the second major surface. The layering arrangement comprises a carbon layer and a conducting polymer layer.

In some embodiments, a method of forming an article is provided. The method includes providing a substrate comprising a surface, applying a dry composition comprising carbon particles to the surface of the substrate, and applying a conducting polymer layer to the surface of the substrate.

The above summary of the present disclosure is not intended to describe each embodiment of the present invention. Other features, objects, and advantages of the invention will be apparent from the description and from the claims.

BRIEF DESCRIPTION OF THE DRAWINGS

The disclosure may be more completely understood in consideration of the following detailed description of various embodiments of the disclosure in connection with the accompanying figures, in which.

DETAILED DESCRIPTION

Successful thermal management of electronic components requires materials capable of quickly and efficiently dissipating heat. Generally, the effectiveness of a thermal management material is a function of the thermal conductivity of the material—materials of high thermal conductivity or, k-value, are superior thermal conductors.

The highest performing thermal conductors are those having thermal conductivity greater than 1000 W/m·K at room temperature. For example, allotropes of carbon having such high thermal conductivity are diamond (1000-2200 W/m·K), carbon nanotubes (up to 3000-3500 W/m·K), graphite (1200 W/m·K) and single-layer graphene (3000-5300 W/m·K). Current thermal management solutions, however, employ much lower k-value materials due to the cost limitations of the aforementioned high performing materials. For example, k-values of 1-5 W/m·K are typical in commercial products, with 10 W/m·K being considered high. Most of these thermal management solutions employ electrically insulating materials such as epoxy or silicone filled with high thermal conductivity materials such as alumina, resulting in composites with thermal conductivity around 5 W/m·K.

Therefore, alternative thermal management materials that exhibit comparable properties to high performing thermal conductors, but that can be produced in larger quantities and at much lower costs may be desirable.

Poly(3,4-ethylenedioxy-thiophene):poly(styrenesulfonate) (PEDOT:PSS) thin films are organic, transparent, and conducting polymers that possess the advantageous characteristics of polymers (including low weight, ease in processing and flexibility) with the physical properties of conventional transparent conductors, such as indium-tin oxide (ITO). For instance, PEDOT:PSS is used as a hole-transporting or electron-blocking layer in organic electronics and as an interface between ITO and the active layer in thin-film organic solar cells (OSCs) and organic light-emitting devices (OLEDs). With an increasing interest towards flexible electronic devices of high power density, it is desirable to improve the capability of PEDOT:PSS based materials to efficiently dissipate heat generated by integrated chips and other electronic components. A primary concern for efficient thermal management in electronics is obtaining high thermal conductivity at low weight, low cost, and low toxicity. The room-temperature thermal conductivity for pure PEDOT:PSS material produced to date (0.2-0.25 W $m^{-1}$ $K^{-1}$), however, is extremely poor in comparison to silicon (149 W $m^{-1}$ $K^{-1}$) and does not address these concerns.

Therefore, alternative (PEDOT:PSS) thin film articles that exhibit improved thermal conductivity properties, as well as methods of making the same in large quantities and at low costs, may be desirable.

In some embodiments, the present disclosure relates to a family of thermal management articles having at least one carbon layer (e.g., a carbon nanolayer) and at least one conducting polymer layer. Surprisingly, the carbon layer and the conducting polymer layer synergistically interact to provide high thermal conductivity in combination with high optical transmission over visible wavelengths and high electrical conductivity (low electrical resistivity). Further-more, these articles can have associated characteristics that may be considered advantageous relative known thermal management articles. For example, the thermal management articles of the present disclosure can be tailored to have a thermal conductivity at room temperature of at least 100 W/m·K, at least 500 W/m·K, at least 1000 W/m·K, or event at least at least 2000 W/m·K while also having a transmission over visible wavelengths of at least 80% and sheet resistances of less than $10^6$ ohms/square. The articles may be compatible with high volume manufacturing processes, e.g., processes in which flexible substrates, optionally in the form of a roll, are processed in a continuous or semi-continuous fashion at a series of stations on a film line.

As used herein, "nano-crystalline graphite" refers to a graphitic carbon material having a first order laser Raman spectrum that exhibits two absorption bands including a pair of weak bands (G peaks) centered at about 1591 $cm^{-1}$ and 1619 $cm^{-1}$, respectively, and a sharp, intense band (D peak) centered at about 1320-1360 $cm^{-1}$.

As used herein, "graphitic carbon platelet" refers to a graphitic carbon material having a first order laser Raman spectrum that exhibits two absorption bands including a sharp, intense band (G peak) centered at about 1570-1580 $cm^{-1}$, and a broader, weak band (D peak) centered at about 1320-1360 $cm^{-1}$.

As used herein, "carbon nanolayer" refers to a layer of carbonaceous material having an average thickness of less than about 1000 nanometers.

As used herein, "conductive polymer" or "conducting polymer" refers to an electrically conductive polymeric material.

As used herein, "room temperature" refers to a temperature in the range of about 16° C. to about 22° C.

As used in this specification and the appended embodiments, the singular forms "a", "an", and "the" include plural referents unless the content clearly dictates otherwise. As used in this specification and the appended embodiments, the term "or" is generally employed in its sense including "and/or" unless the content clearly dictates otherwise.

As used in this specification, the recitation of numerical ranges by endpoints includes all numbers and ranges subsumed within that range (e.g. 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

In accordance with exemplary embodiments of the present disclosure, an article may be formed that includes a substrate having a first, or upper major surface and a second, or lower major surface opposite the upper major surface. Either or both of the upper major surface and the lower major surface may bear thereon one or more layering arrangements, or stacks that includes one or more layers or films. In some embodiments, each of the one or more layering arrangements may include one or more carbon layers and one or more conducting polymer layers.

In various embodiments, the substrate may be rigid or flexible. The substrate may have a sufficient mechanical integrity to be self-supporting. The substrate may consist essentially of only one layer of material, or it may have a multilayered construction. The substrate may have any shape and thickness. The substrate may be continuous or perforated.

In some embodiments, the substrate may be a plastic substrate from among polyolefins, e.g. polypropylene (PP), various polyesters, e.g. polyethylene terephthalate (PET), polymethylmethacrylate (PMMA) and other polymers such as polyethylene naphthalate (PEN), polyethersulphone (PES), polyestercarbonate (PC), polyetherimide (PEI), polyarylate (PAR), polyimide (PI), or combinations thereof. Alternatively, the substrate may be a metal (e.g., Al, Cu, Ni, Ag, Au, Ti, and/or Cr), metal oxide, glass, composite, paper, fabric, non woven, or combinations thereof. In various embodiments, the substrate may include a transparent polymeric film such as PET or PEN.

In illustrative embodiments, the carbon layer may include any form or type of elemental carbon. Exemplary carbons useful in the carbon layer include conductive carbons such as graphite, carbon black, lamp black, or other conductive carbon materials known to those of skill in the art. In various embodiments, exfoliatable carbon particles (i.e., those that break up into flakes, scales, sheets, or layers upon application of shear force) may be used to form the carbon layer. An example of useful exfoliatable carbon particles is HSAG300 graphite particles, available from Timcal Graphite and Carbon, Bodio, Switzerland. Other useful materials include but are not limited to SUPER P and ENSACO (Timcal), and M850 available from Asbury Carbon, Asbury, N.J. The carbon particles may also include carbon nanotubes, including multi-walled carbon nanotubes. In some embodiments, the carbon particles used to form the carbon layer may have a Mohs' hardness between 0.4 and 3.0, and may a largest dimension of less than about 100 microns. In some embodiments, the carbon layer may include additional components such as polymeric microspheres and/or other microspheres.

As will be discussed in greater detail below, in various embodiments, the carbon layer may be formed on or over the substrate by application of a dry composition that includes carbon particles. For purposes of the present disclosure, "dry" means free or substantially free of liquid. Thus, the dry composition which forms the carbon layer may be provided in a solid particulate form, rather than in a liquid or paste form.

Figure 1:
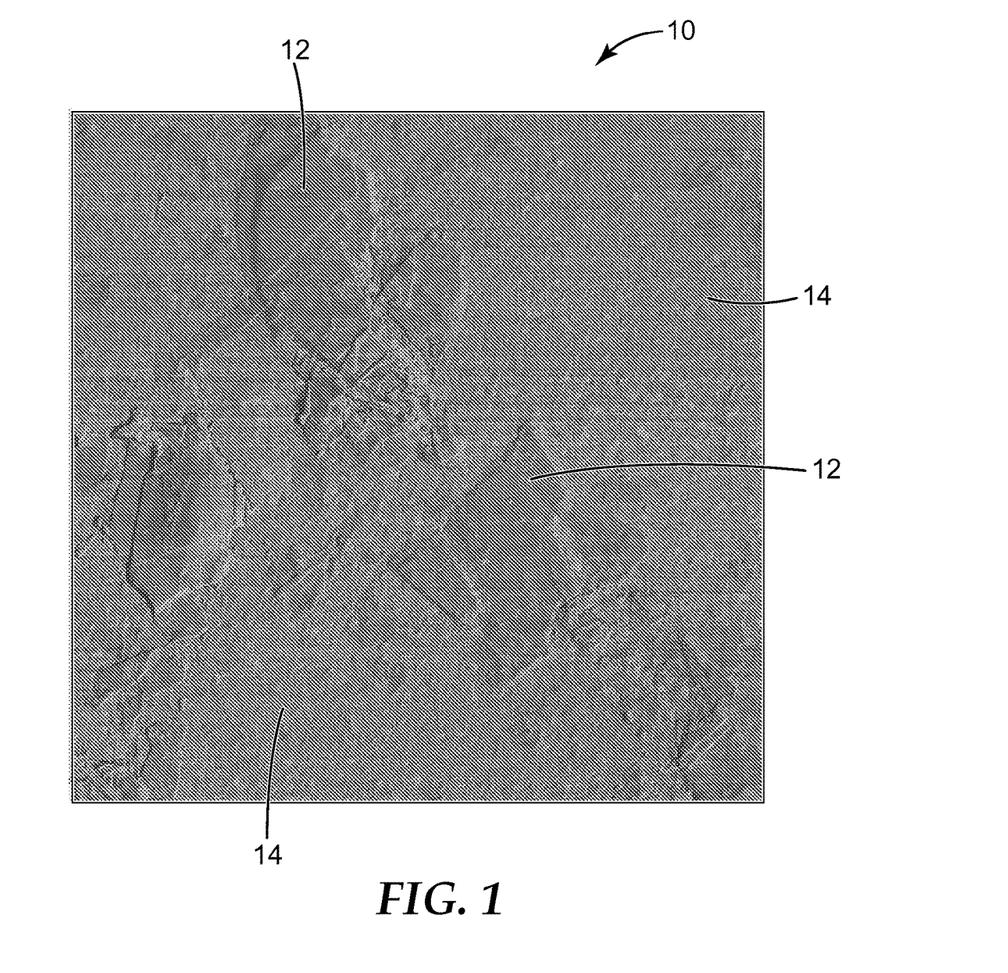
FIG. 1 is a scanning tunneling microscope image of a carbon layer formed in accordance with some embodiments of the present disclosure.

In various embodiments, as a result of the application methods disclosed herein, the carbon layer may have a characteristic morphology that is distinct from single layer graphene on the one hand, and from amorphous carbon on the other hand. FIG. 1 is a scanning tunneling microscope (STM) image 10 of a carbon layer of the present disclosure. The scale of the image is such that the length of each side of the square-shaped image is 6 micrometers. The image reveals a morphology in which graphitic carbon platelets 12 are embedded in nano-crystalline graphite 14.

In some embodiments, the carbon layer may be formed on or over the substrate at an average thickness of less than 500 microns, less than 100 microns, less than 3 microns, less than 1000 nanometers, less than 200 nanometers, or even less than 50 nanometers. In some embodiments, the carbon layer may formed on or over the substrate at an average thickness in a range of from 25 nanometers to 3 microns, from 50 nanometers to 1000 nanometers, or from 100 nanometers to 500 nanometers. In various embodiments, the carbon layer may be a carbon nanolayer which is formed on or over the substrate at an average thickness of less than 1000 nanometers, less than 200 nanometers, less than 50 nanometers, less than 10 nanometers, or even less than 1 nanometer. In illustrative embodiments, the carbon layer may have a uniform thickness. For purposes of the present disclosure, "uniform thickness" means having a relatively consistent thickness of coating over the desired dimension of the article in the plane of the substrate. The uniformity of the layer may be evaluated, for example, by optical evaluation using an optical densitometer. To evaluate uniformity, a transmission reading (or, alternatively, reflectance) is taken at six points and compared to determine the variation. In some embodiments, the variation in thickness of the carbon layer is no more than 10%, no more than 5%, or no more than 3%. The wavelength to be evaluated is dependent on the physical properties of the layer and of the substrate and is appropriately selected to accurately assess the uniformity of the coating. For example, a coating that is visible under ordinary light conditions may be evaluated using a wavelength of light in the visible range, such as 550 nm, the generally accepted midpoint of visible light.

In illustrative embodiments, the carbon layer may be formed on or over a surface (e.g., a major surface) of the substrate over the entire area of the surface, over nearly the entire area of the surface, or over only a portion of the surface (e.g., one or more surface segments, one or more patterns, etc.).

In various embodiments, the carbon layer of the present disclosure may be a carbon layer as described in U.S. Pat. No. 6,511,701, which is incorporated herein by reference in its entirety.

In some embodiments, the conducting polymer layer may include a π-conjugated organic polymer. In some embodiments, the conducting polymer layer may be formed from at least one conductive polymer from among polyacetylenes, polyanilines, substituted polyanilines, polypyrroles, polythiophenes, substituted polythiophenes, polycarbozoles, polyindoles, poly(p-phenylene)s, poly(p-phenylenevinylene)s, poly(ethylenedioxythiophene)s, or the like, and combinations thereof. For example, the conducting polymer layer may include a polyethylenedioxythiophene ("PEDOT") polymer doped with polystryrene sulfonate ("PSS") (referred to, herein, as PEDOT:PSS) The PEDOT:PSS may be formed from a solution comprised of water, polyethylenedioxythiophene and polystyrenesulfonic acid. In some embodiments, the conducting polymer layer may be applied as a solution and laid down using conventional techniques such as spin coating, dip coating, roll coating, spray coating, thermal evaporation, or the like.

In some embodiments, the one or more conducting polymer layers may be formed on or over the substrate at a thickness of less than 1000 nanometers, less than 500 nanometers, less than 50 nanometers, less than 30 nanometers, or even less than 10 nanometers. In some embodiments, the conducting polymer layer may formed on or over the substrate at a thickness in a range of from 10 nanometers to 1000 nanometers, from 20 nanometers to 500 nanometers, or from 20 nanometers to 80 nanometers.

In illustrative embodiments, the conducting polymer layer may be formed on or over a surface (e.g., a major surface) of the substrate over the entire area of the surface, over nearly the entire area of the surface, or over only a portion of the surface (e.g., one or more surface segments, one or more patterns). In various embodiments, the conducting polymer layer may be formed on or over at least the substrate surface portions over which the carbon layer is formed.

In some embodiments, the layering arrangement may be arranged such that a carbon layer is adjacent, or closest to the substrate. Alternatively, the layering arrangement may be arranged such that a conducting polymer layer is adjacent, or closest to the substrate. In various embodiments, the layering arrangements of the present disclosure may include a plurality of carbon layers and/or a plurality of conducting polymer layers. For example, the layering arrangements may include any number of alternating carbon and conducting polymer layers (e.g., substrate/carbon/conducting polymer/carbon/conducting polymer, etc.).

In various embodiments, the layering arrangement of the present disclosure may include one or more additional layers (in addition to the one or more carbon layers and one or more conducting polymer layers) disposed on one or more surfaces of the substrate. The one or more additional layers may be disposed between the substrate and the layering arrangement, between adjacent layers of the layering arrangement, on top of the layering arrangement, or combinations thereof. For example, in illustrative embodiments, one or more thermal contact enhancement layers may be disposed between the substrate and the layering arrangement and/or adjacent layers of the layering arrangement. Generally, the thermal contact enhancement layers may conform to the topography of the substrate or a layer of the layering arrangement such that intimate thermal contact between the substrate and an adjacent layer of the layering arrangement, and/or adjacent layers of the layering arrangement may be achieved. In this regard, the thermal contact enhancement layers may be formed from an elastomeric material. Those skilled in the art will recognize that other layers and/or materials may be included in the layering arrangement such as, for example, pore formers, surfactants, flow agents, antioxidants, adhesives, and/or other conductive additives. In various constructions according to the present disclosure, the substrate and any of the additional layers or materials may be transparent or substantially transparent in the visible spectrum.

In illustrative embodiments, the layering arrangements of the present disclosure, which may be disposed on a surface (e.g., a major surface) of a substrate to form an article, and which may include a carbon layer and a conducting polymer layer, may surprisingly and advantageously impart beneficial properties to such articles. For example, the layering arrangements of the present disclosure may provide the articles with a thermal conductivity that is significantly higher (e.g., 50% higher, 100% higher, 200% higher, or even 300% higher) than the additive thermal conductivity obtained from the thermal conductivities of the carbon layer and the conducting polymer layer considered separately, thus exhibiting synergistic behavior.

In various embodiments, the layering arrangements of the present disclosure may be tailored to have a thermal conductivity that renders them especially useful for thermal management applications. In various embodiments, the layering arrangements may provide the articles with a thermal conductivity at room temperature of at least 100 W/m·K, at least 500 W/m·K, at least 1000 W/m·K, at least 1500 W/m·K, or event at least at least 2200 W/m·K. The layering arrangements may provide the articles with a thermal conductivity at room temperature in a range of from 10 W/m·K to 2200 W/m·K, from 500 W/m·K to 2200 W/m·K, or from 1000 W/m·K to 2200 W/m·K. The thermal conductivity may be varied, for example, by varying the thickness and/or quality of either or both of the carbon layer and the conducting polymer layer. It is to be appreciated that thermal management articles of the present disclosure are particularly advantageous given that for the same thickness a considerably greater amount of heat can be conducted per unit time with the present layering arrangements as compared to the thermal management articles having low k-values.

In some embodiments, the articles of the present disclosure may have relatively high transmittance over visible wavelengths. For example, the percent transmission of the articles may be at least 30, at least 50, at least 60, at least 70, or even at least 80% at 550 nm or over the visible wavelength range (400-700 nanometers). In illustrative embodiments, the layering arrangements may provide the articles with electrical conductivity. For example, the layering arrangements may provide the articles with sheet a resistance of no more than $10^6$ ohms/square, no more than $2*10^6$ ohms/square, no more than $10^7$ ohms/square, or even no more than $10^8$ ohms/square.

The present disclosure further relates to methods for making the thermal management articles described above. In some embodiments, the method may include providing a substrate onto which the one or more layering arrangements may be deposited or formed. It is to be appreciated the methods of the present disclosure may accommodate deposition of any layer of the layering arrangement while the substrate is stationary or, alternatively, while the substrate is being conveyed by a suitable conveying apparatus (e.g., a moving web of the substrate).

In some embodiments, the method may include depositing the carbon layer onto a major surface of the substrate. The carbon layer may be deposited onto the substrate directly (i.e., onto a bare, uncoated substrate) or indirectly (i.e., onto one or more coatings disposed on the substrate).

In some embodiments, depositing the carbon layer may include buffing an amount of a carbon containing composition onto a major surface of the substrate. As used herein, "buffing" refers to any operation in which a pressure normal to a subject surface (e.g., a major surface of a substrate) coupled with movement (e.g., rotational, lateral, combinations thereof) in a plane parallel to said subject surface is applied. In illustrative embodiments, the carbon material may be applied as a dry composition that includes carbon particles and optionally additional components such as polymeric microspheres and/or other microspheres. Thus, the composition to be applied is provided in a solid particulate form, rather than in a liquid or paste form. The carbon particles can be any form or type of carbon. Exemplary carbons include conductive carbons such as graphite (macro-, micro- or nanocrystalline), turbostratic graphitic materials carbon black, lamp black, or other conductive carbon materials. In some embodiments, exfoliatable carbon particles, i.e., those that break up into flakes, scales, sheets, or layers upon application of shear force, are used. An example of useful exfoliatable carbon particles is HSAG300 graphite particles, available from Timcal Graphite and Carbon, Bodio, Switzerland. Other useful materials include but are not limited to SUPER P and ENSACO (Timcal). The carbon particles can also be or comprise carbon nanotubes, including multi-walled carbon nanotubes. The carbon particles may have a Mohs' hardness between 0.4 and 3.0 and a largest dimension of less than about 100 microns.

Buffing of the carbon layer may be carried out using any buffing apparatus known in the art (e.g., power sander, power buffer, orbital sander, random orbital sander) suitable for applying dry particles to a surface, or manually (i.e., by hand). An exemplary buffing apparatus may include a motorized buffing applicator (e.g., disc, wheel) which may be configured to apply a pressure normal to a subject surface as well as rotate in a plane parallel to said subject surface. The buffing applicator may include a buffing surface that contacts with, or is intended to contact with, the subject surface during a buffing operation. In some embodiments, the buffing surface may include metal, polymer, glass, foam (e.g., closed-cell foam), cloth, paper, rubber, or combinations thereof. In various embodiments, the buffing surface may include an applicator pad that may be made of any appropriate material for applying particles to a surface. The applicator pad may, for example, be made of woven or non-woven fabric or cellulosic material. The applicator pad may alternatively be made of a closed cell or open cell foam material. In other cases, the applicator pad may be made of brushes or an array of nylon or polyurethane bristles. Whether the applicator pad comprises bristles, fabric, foam, and/or other structures, it may have a topography wherein particles of the composition to be applied can become lodged in and carried by the applicator pad.

In some embodiments, the buffing applicator may be configured to move in a pattern parallel to the subject surface and to rotate about a rotational axis perpendicular to the subject surface. The pattern may include a simple orbital motion or random orbital motion. Rotation of the buffing applicator may be carried out as high as 100 orbits per minute, as high as 1,000 orbits per minute, or even as high as 10,000 orbits per minute. The buffing applicator may be applied in a direction normal to the subject surface at a pressure of a least 0.1 g/cm$^2$, at least 1 g/cm$^2$, at least 10 g/cm$^2$, at least 20 g/cm$^2$, or even at least 30 g/cm$^2$.

The carbon containing composition can be applied to a major surface of the substrate in a number of ways. In one approach, the composition can first be applied directly to the major surface, and then the buffing applicator may contact the composition and the major surface. In another approach, the composition can first be applied to the buffing surface of the buffing apparatus, and the particle-loaded buffing surface may then contact the surface of the substrate. In still another approach, a portion of the composition can be applied directly to the surface, and another portion of the composition can be applied to the buffing surface of the buffing apparatus, after which the particle-loaded buffing surface may contact the surface and remainder of the composition.

In some embodiments, the buffing operation of the present disclosure can be used to produce a high quality thin carbon layer (e.g., a carbon nanolayer) on a surface of the substrate. The thickness of the buffed layer may be controlled by controlling the buffing time. Generally, the thickness of the coating may increase linearly with buffing time after a certain rapid initial increase. The coating thickness of the carbon layer can also be controlled by controlling the amount of the carbon containing composition used during the buffing operation.

The buff coating process described herein may be used to produce high quality, low cost layers of carbon that are uniform in thickness, of high thermal conductivity, of high transparency, and of adequate sheet resistance. Additionally, as previously discussed, the carbon layers produced by the buff coating process of the present disclosure may have a characteristic morphology that is distinct from single layer graphene on the one hand, and from amorphous carbon on the other hand. For example, the carbon layers of the present disclosure may have a morphology in which graphitic carbon platelets are embedded in nano-crystalline graphite.

In illustrative embodiments, adherence of the carbon layer to the substrate may be assisted by heating the substrate prior to, during, or after the buffing operation to a temperature such that the adhesion of the layer is enhanced. Exemplary methods of heat input to the substrate may include oven heating, heat lamp heating (e.g., infrared), or a heated platen in contact with the substrate.

In various embodiments, the carbon layer may be deposited onto the substrate in accordance with the methods described in U.S. Pat. No. 6,511,701, which has been incorporated herein by reference in its entirety.

In some embodiments, the methods of the present disclosure may further include depositing a conductive polymer onto or over a major surface of the substrate. The conductive polymer layer may be deposited onto the substrate directly (i.e., onto a bare, uncoated substrate) or indirectly (i.e., onto one or more coatings disposed on the substrate). For example, the conductive polymer layer may be deposited onto the substrate such that it overlays a portion, nearly all, or all of the carbon layer to form a layering arrangement in accordance with embodiments of the present disclosure. In some embodiments, the conducting polymer layer may be formed from at least one electrically conductive polymer from among polyacetylenes, polyanilines, substituted polyanilines, polypyrroles, polythiophenes, substituted polythiophenes, polycarbozoles, polyindoles, poly(p-phenylene)s, poly(p-phenylenevinylene)s, poly(ethylenedioxythiophene)s, or the like, and combinations thereof. For example, the conducting polymer layer may include PEDOT:PSS. In various embodiments, the conducting polymer layer may be applied as solution and laid down using conventional techniques such as spin coating, dip coating, roll coating, spray coating, thermal evaporation, or the like.

In some embodiments, following formation of a first carbon layer and a first conductive polymer layer as described above, the methods of the present disclosure may include forming any number of additional carbon layers or conductive polymer layers over the surface of the substrate. For example, the methods may include forming one or more additional carbon layers and one or more additional conductive polymer layers in alternating fashion.

In illustrative embodiments, during or following formation of any or all of the above-discussed layers, the coated substrate may be subjected to a compression step to facilitate strong contact between the substrate and an adjacent layer of the layering arrangement, or between adjacent layers of the layering arrangement (e.g., between a carbon layer and a conducting polymer layer). Generally, the compression step may include any operation in which a pressure normal to a subject surface on which one or more layers of the layering arrangement is formed is applied. The compression operation may include applying a pressure to the subject surface via, for example, a sheet press, a roll press, or the like.

Generally, the thermal management articles of the present disclosure may be incorporated into or associated with any heat generating device or component to facilitate heat dissipation. For example, the thermal management articles may serve as a heat conducting medium for placement between a heat generating device (e.g., integrated circuits, microprocessors, light emitting diodes, and other microelectronic components) and a heat sink to facilitate transfer of heat from the device to the sink. As an additional example, the thermal management articles of the present disclosure may form, or augment, a heat sink, which is thermally connected to a heat generating device.

LISTING OF EMBODIMENTS

Embodiment 1 is an article comprising:
a substrate comprising a first major surface and optionally a second major surface; and
a layering arrangement disposed on either or both of the first major surface and the second major surface;
wherein the layering arrangement comprises a carbon layer and a conducting polymer layer.

Embodiment 2 is the article of embodiment 1, wherein the carbon layer has a morphology comprising graphitic carbon platelets embedded in nano-crystalline graphite.

Embodiment 3 is the article of any one of embodiments 1-2, wherein the carbon layer has an average thickness of less than 1000 nanometers.

Embodiment 4 is the article of any one of embodiments 1-3, wherein the layering arrangement provides the article with a thermal conductivity of at least 100 W/m·K.

Embodiment 5 is the article of any one of embodiments 1-4, wherein the article has an optical transmission of at least 80% at 550 nm.

Embodiment 6 is the article of any one of embodiments 1-5, wherein the carbon layer is disposed between the substrate and the conducting polymer layer.

Embodiment 7 is the article of any one of embodiments 1-6, wherein the conducting polymer layer comprises polyacetylenes, polyanilines, substituted polyanilines, polypyrroles, polythiophenes, substituted polythiophenes, polycarbozoles, polyindoles, poly(p-phenylene)s, poly(p-phenylenevinylene)s, poly(ethylenedioxythiophene)s, or combinations thereof.

Embodiment 8 is the article of any one of embodiments 1-7, wherein the conducting polymer layer comprises PEDOT:PSS.

Embodiment 9 is the article of any one of embodiments 1-8, wherein the conducting polymer layer has an average thickness of less than 100 nanometers.

Embodiment 10 is the article of any one of embodiments 1-9, wherein the substrate comprises a transparent polymeric film.

Embodiment 11 is a method of forming an article comprising:
providing a substrate comprising a surface;
applying a dry composition comprising carbon particles to the surface of the substrate; and
applying a conducting polymer layer to the surface of the substrate.

Embodiment 12 is the method of embodiment 11, wherein applying the dry composition comprises buffing the dry composition on the surface to form a carbon layer.

Embodiment 13 is the method of embodiment 11, wherein applying the dry composition comprises buffing the dry composition on the surface to form a carbon layer having a morphology comprising graphitic carbon platelets embedded in nano-crystalline graphite.

Embodiment 14 is the method of any one of embodiments 12-13, wherein the carbon layer has an average thickness of less than 1000 nanometers.

Embodiment 15 is the method of any one of embodiments 12-13, wherein the carbon and conducting polymer layers provide the article with a thermal conductivity of at least 100 W/m·K.

Embodiment 16 is the method of any one of embodiments 11-15, wherein the article has an optical transmission of at least 80% at 550 nm.

Embodiment 17 is the method of any one of embodiments 12-16, wherein the carbon layer is disposed between the substrate and the conducting polymer layer.

Embodiment 18 is the method of any one of embodiments 11-17, wherein the conducting polymer layer comprises polyacetylenes, polyanilines, substituted polyanilines, polypyrroles, polythiophenes, substituted polythiophenes, polycarbozoles, polyindoles, poly(p-phenylene)s, poly(p-phenylenevinylene)s, poly(ethylenedioxythiophene)s, or combinations thereof.

Embodiment 19 is the method of any one of embodiments 11-18, wherein the conducting polymer layer comprises PEDOT:PSS.

Embodiment 20 is the method of any one of embodiments 11-19, wherein the substrate comprises a transparent polymeric film.

The operation of the present disclosure will be further described with regard to the following detailed examples. These examples are offered to further illustrate the various specific and preferred embodiments and techniques. It should be understood, however, that many variations and modifications may be made while remaining within the scope of the present disclosure.

EXAMPLES

Test Methods
Method for Photothermal Deflection Spectroscopy (PDS) Measurements

Thermal properties and optical absorption coefficient of the articles according to the present disclosure were measured at room temperature and at $\lambda > 450$ nm using a Photothermal Deflection Spectroscopy (PDS) technique described in S. E. Bialkowski *Photothermal Spectroscopy Methods for Chemical Analysis* John Wiley, New York 1996 (Bialkowski), which is incorporated by reference herein in its entirety. This optically pulsed pump-probe technique allowed simultaneous determination of the optical properties, thermal diffusivity, and thermal conductivity of a sample from the phase and amplitude of the deflection angle of a probe laser at the interface between a photothermal fluid and an absorbing thin film. The film was illuminated and heated by strong monochromatic light pulses at a pumping frequency, $\omega$. 3M™ Fluorinert™ Electronic Liquid FC-72 (obtained from 3M Company, St. Paul, Minn.) was used as a photothermal fluid and the film to be measured was heated only through the energy deposited inside the absorbing film by the pump light pulses.

Figure 2:
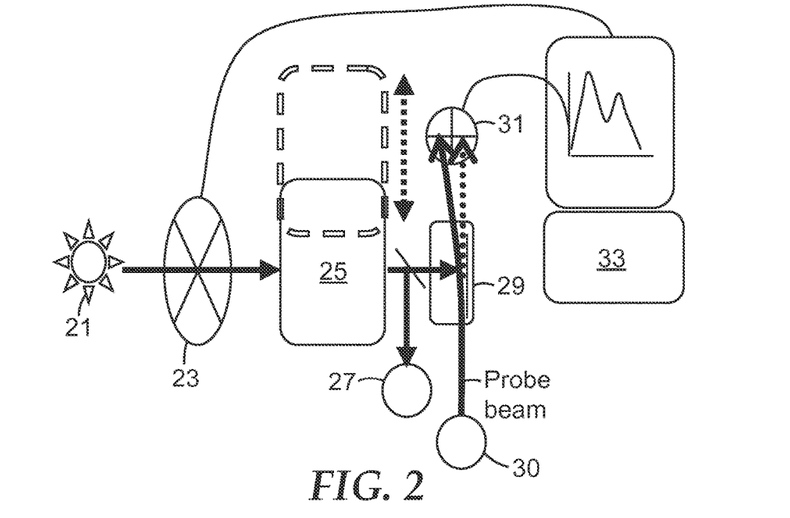
FIG. 2 depicts a schematic diagram of an experimental setup for carrying out photothermal deflection spectroscopy measurements in accordance with some embodiments of the present disclosure.

FIG. 2 depicts a schematic setup of the PDS system used for the PDS Measurements. As shown, the setup includes a light source 21 (1000-watt lamp, Model QTH 201-1K, obtained from Sciencetech Inc., London ON), an optical chopper 23 (Model MC2000, obtained from Thorlabs, Inc., Newton, N.J.), a monochromator 25 (Model MonoSpec 27 Czerny-Turner, obtained from Jarrell Ash Inc., Boston, Mass.) a photodiode 27 (Model BPW34, obtained from Vishay Intertechnology Inc., Malvern Pa.), a test sample 29, a stabilized Helium-Neon probe laser beam 30 (Model STP1, obtained from Melles-Griot Inc., Carlsbad, Calif.), a position detector 31 (Model PDQ8051, obtained from Thorlabs, Inc), and a lock-in amplifier 33 (Model 5209, obtained from Princeton Instruments, Trenton, N.J.). A range of different pump wavelengths ($\lambda = 800$ nm, 700 nm, 600 nm, 500 nm and 400 nm) and a constant pump frequency ($\omega = 20$ Hz) were used. This setup allowed changing the geometric width, B, of the pump light pulses incident to the sample from the aperture of the slits at the monochromator. Three different beam widths ($B_1 = 6$ mm, $B_2 = 3$ mm and $B_3 = 1$ mm) were used to verify measurements, although most accurate results were obtained at the highest possible aperture, $B_1$. At each wavelength and slit aperture, the power $P_\lambda$ of the pump was determined during each measurement by the response of the photodiode 27. In samples such as PEDOT:PSS and carbon layers, assuming that B was comparable to the in-plane thermal diffusion length in the film ($D_f$) was considered safe. PDS measurements allowed the determination of $D_f$, the thermal diffusivity of a film sample (e.g., the articles according to the present invention), from the phase of the PDS signal. Using the optical absorption coefficient, $\alpha$, determined from UV-Vis spectrometric data at $\lambda < 450$ nm, and $D_f$, the thermal conductivity of the film was then calculated with the PDS equations set forth in Bialkowski.

Data acquisition and instrument control were performed by interfacing the optical chopper 23, monochromator 25, and lock-in amplifier 33 to a desktop computer, and using a dedicated software code written under LabVIEW™ (available from National Instruments Corporation, Austin, Tex.).

Method for Determining Sheet Resistance

The resistance of the samples was measured using four-probe technique. Droplets of InGa eutectic enclosed in 1 mm² rubber gaskets were used to make four electrical contacts to the sample. A Keithley 2400 source meter obtained from Keithley Instruments Inc., Cleveland, Ohio, was used to measure the resistance of the sample.

Method for Determining % Transmittance of Films

The % transmittance of films according the examples and comparative examples described below was determined in a wavelength range from 350 nm to 600 nm using a UV-Vis Spectrophotometer (Model DMS80 obtained from Varian, Inc., Palo Alto, Calif.).

Comparative Example 1 (CE1)

A carbon layer or coating was formed, according to the buffing processes discussed above, on a transparent, flexible PET substrate having a nominal thickness of 50 micrometers (Melinex® Polyester Film 393, obtained from Cadillac Plastics Inc, Toronto). A graphite powder (TIMREX®HSAG 300 obtained from TIMCAL Ltd., Switzerland) was used as the dry composition. The carbon layer was buffed to an average thickness of about 20 nm. The sample of this CE1 is also referred to as "Bare TCF". Since the thickness of the carbon layer of CE1 was very small, conventional thermal techniques could not be used to determine the thermal conductivity of the samples. The thermal conductivity of the carbon nanolayer coating of CE1 was measured using the Method for PDS Measurements described above, and observed to be about 600 W/m·K.

Comparative Example 2 (CE2)

PEDOT:PSS polymer (obtained from Sigma Aldrich Chemical Company, Oakville, Canada) layers or coatings were prepared by spin coating on a 50 micrometer thick PET film (Melinex® Polyester Film 393, obtained from Cadillac Plastics Inc, Toronto) at spin coating speeds of 500 and 2500 revolutions per minute (rpm). The samples of this CE2 are, collectively, referred to as "PEDOT:PSS on PET". The thicknesses of the PEDOT:PSS on PET coatings of this CE2 were determined by Atomic Force Microscopy (AFM).

Example 1 (EX1)

Samples were prepared in the same manner as CE2, described above, except that the PEDOT:PSS polymer layer was deposited onto a carbon layer disposed on substrate as described in CE1 (i.e., 50 micrometer thick PET substrate with a 20 nm thick carbon nanolayer coating). The PEDOT:PSS polymer coatings of EX1 were applied at spin coating speeds ranging from 500 to 2500 revolutions per minute (rpm). These samples of EX1 are, collectively, referred to as "PEDOT:PSS on TCF". The thicknesses of the PEDOT:PSS on TCF coatings of this EX1 were determined by Atomic Force Microscopy (AFM).

Figure 3:
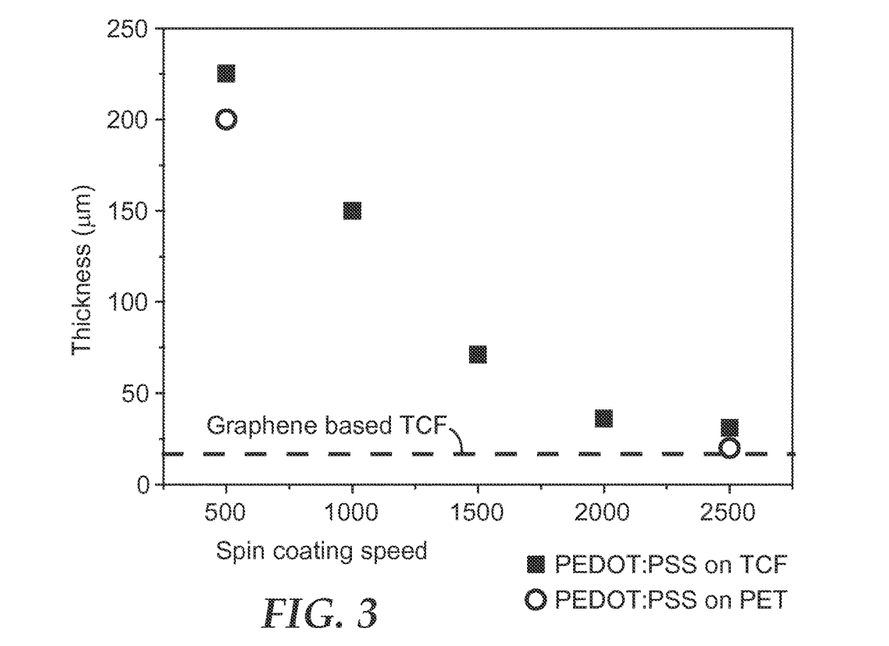
FIG. 3 is a plot of coating thickness as a function of coating speed observed with respect to articles formed in accordance with some embodiments of the present disclosure.

FIG. 3 is a plot of the thicknesses of the coatings of CE2 (PEDOT:PSS on PET) and EX1 (PEDOT:PSS on TCF) versus the spin coating speed in rpm. The dotted line of FIG. 3 represents the thickness of the carbon layer.

The sheet resistance, % transmittance, and thermal conductivity of the CE1, CE2, and EX1 samples were determined using the test methods described above.

Figure 4:
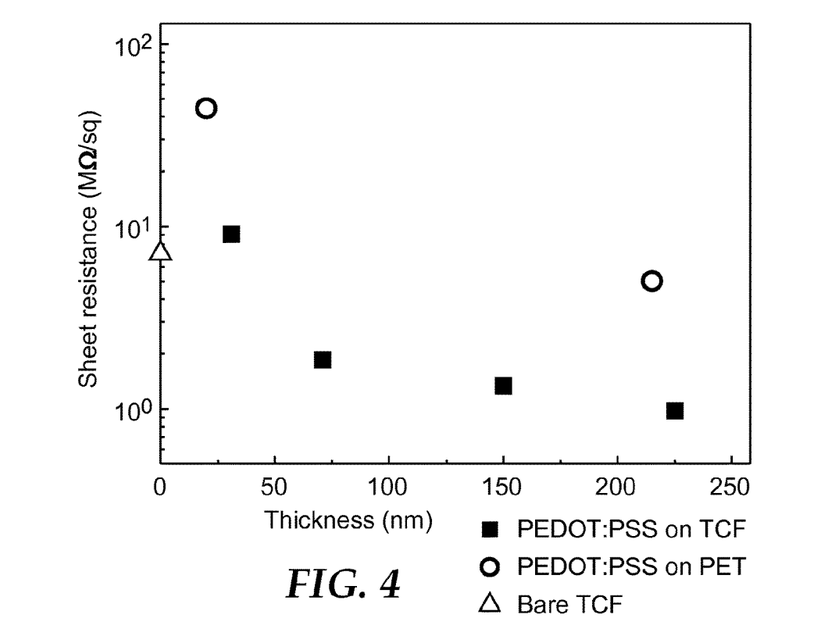
FIG. 4 is a plot of sheet resistance as a function of coating thickness observed with respect to articles formed in accordance with some embodiments of the present disclosure.

FIG. 4 shows the sheet resistances of CE1 (Bare TCF), CE2 (PEDOT:PSS on PET), and EX1 (PEDOT:PSS on TCF) samples versus the PEDOT:PSS coating thickness. The data confirms that the sheet resistance of EX1 samples decreased as the thickness of PEDOT:PSS coatings increased. The data shows that the sheet resistances of EX1 samples were well below CE2 samples of comparable thicknesses.

Figure 5:
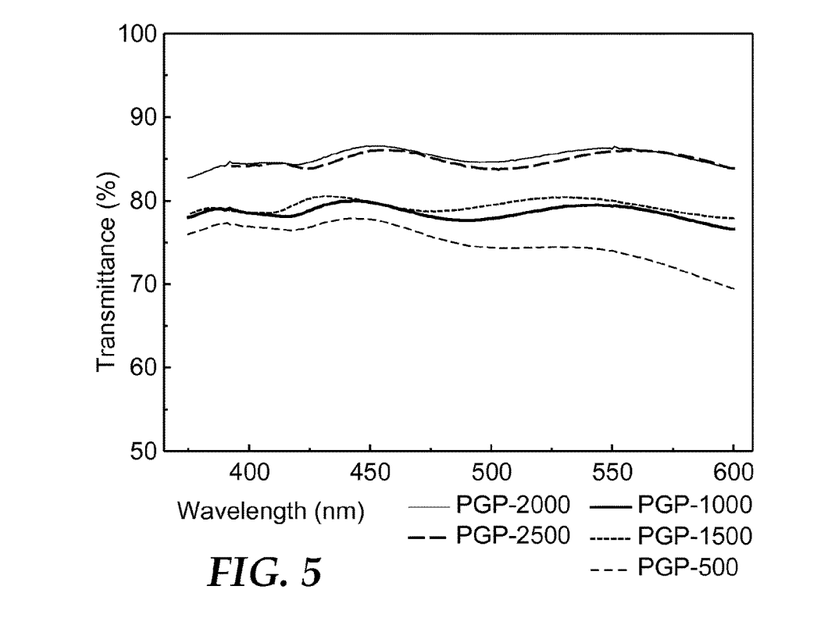
FIG. 5 is a plot of percent optical transparency as a function of optical wavelength observed with respect to articles formed in accordance with some embodiments of the present disclosure.

FIG. 5 is a graph of % transmittance of EX1 samples in the visible wavelength region from 350-600 nm. In FIG. 5, EX1 samples prepared at spin coating speeds of 500, 1000, 1500, 2000 and 2500 rpm are referred to as "PGP-500", "PGP-1000", "PGP-1500", "PGP-2000" and "PGP-2500", respectively. The results indicate that the samples of EX1 were transparent. Also, the appearance of interference fringes (local minima and maxima in optical transmission) indicates that the coatings of the EX1 samples were of optical quality.

Figure 6:
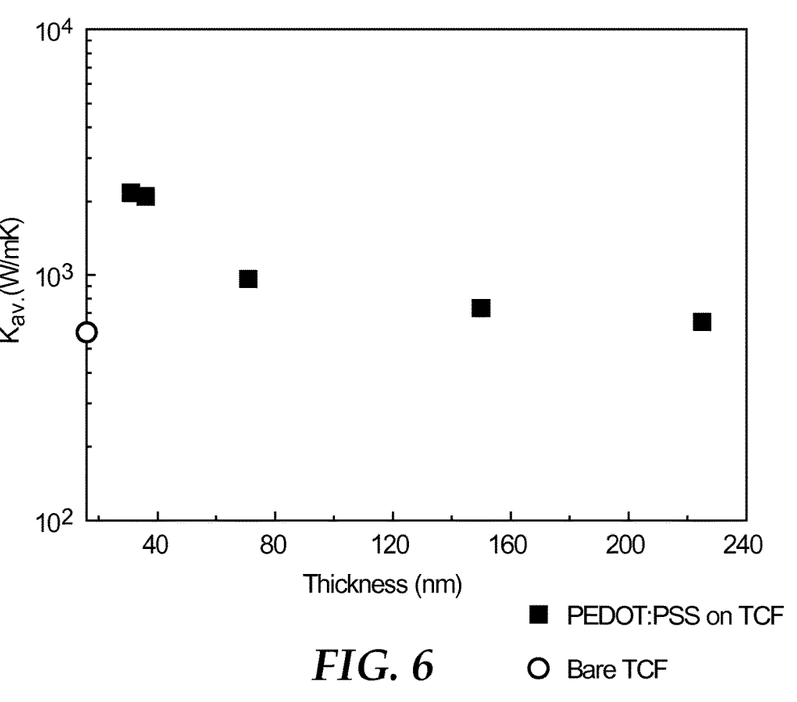
FIG. 6 is a plot of thermal conductivity as a function of film thickness observed with respect to articles formed in accordance with some embodiments of the present disclosure.

FIG. 6 shows the thermal conductivity of CE1 and EX1 samples versus PEDOT:PSS coating thickness. It is evident from data that the thermal conductivity of EX1 (PEDOT:PSS on TCF) samples was surprisingly and unexpectedly higher than that of the CE1 sample (Bare TCF). The known thermal conductivity of PEDOT:PSS alone is 0.25 W/m·K, which is very low, and that of the CE1 sample was about 600 W/m·K. Clearly, the measured k-values of the layered combination of the carbon layer and the PEDOT:PSS layer are much higher than the additive k-values of the materials considered separately, which suggests synergistic behavior. This unexpected improvement was most significant for the EX1 samples having a PEDOT:PSS layer thickness of 30 nm. As shown, the two EX1 samples prepared at a spin coating speed of 2000 rpm (~30 nm thick PEDOT:PSS coating) had thermal conductivities of more than 2000 W/m·K, which is comparable to that of diamond.

What is claimed is:

1. An article comprising:
   a substrate comprising a first major surface and optionally a second major surface; and
   a layering arrangement disposed on either or both of the first major surface and the second major surface;
   wherein the layering arrangement comprises a carbon layer and a conducting polymer layer;
   wherein the carbon layer has a morphology comprising graphitic carbon platelets embedded in nano-crystalline graphites;
   wherein the graphitic carbon platelets have a first order laser Raman spectrum that exhibits two absorption bands including a sharp, intense band (G peak) centered at about 1570-1580 $cm^{-1}$, and a broader, weak band (D peak) centered at about 1320-1360 $cm^{-1}$; and
   wherein the nano-crystalline graphite has a first order laser Raman spectrum that exhibits two absorption bands including a pair of weak bands (G peaks) centered at about 1591 $cm^{-1}$ and 1619 $cm^{-1}$, respectively, and a sharp, intense band (D peak) centered at about 1320-1360 $cm^{-1}$.

2. The article of claim 1, wherein the carbon layer has an average thickness of less than 1000 nanometers.

3. The article according to claim 1, wherein the layering arrangement provides the article with a thermal conductivity of at least 100 W/m·K.

4. The article according to claim 1, wherein the article has an optical transmission of at least 80% at 550 nm.

5. The article according to claim 1, wherein the carbon layer is disposed between the substrate and the conducting polymer layer.

6. The article according to claim 1, wherein the conducting polymer layer comprises polyacetylenes, polyanilines, substituted polyanilines, polypyrroles, polythiophenes, substituted polythiophenes, polycarbozoles, polyindoles, poly(p-phenylene)s, poly(p-phenylenevinylene)s, poly(ethylenedioxythiophene)s, or combinations thereof.

7. The article according to claim 1, wherein the conducting polymer layer comprises PEDOT:PSS.

8. The article according to claim 1, wherein the conducting polymer layer has an average thickness of less than 100 nanometers.

9. The article according to claim 1, wherein the substrate comprises a transparent polymeric film.

* * * * *